(12) United States Patent
Varanasi

(10) Patent No.: US 10,121,521 B2
(45) Date of Patent: Nov. 6, 2018

(54) READ THRESHOLD VOLTAGE SELECTION

(71) Applicant: Micron Technology, Inc., Boise, ID (US)

(72) Inventor: Chandra C. Varanasi, Broomfield, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/837,036

(22) Filed: Dec. 11, 2017

(65) Prior Publication Data

US 2018/0102146 A1    Apr. 12, 2018

Related U.S. Application Data

(62) Division of application No. 15/044,185, filed on Feb. 16, 2016, now Pat. No. 9,911,466.

(51) Int. Cl.
| | |
|---|---|
| *G11C 7/00* | (2006.01) |
| *G06F 11/10* | (2006.01) |
| *G11C 29/52* | (2006.01) |
| *G11C 7/14* | (2006.01) |

(52) U.S. Cl.
CPC ............ *G11C 7/00* (2013.01); *G06F 11/1012* (2013.01); *G06F 11/1068* (2013.01); *G11C 7/14* (2013.01); *G11C 29/52* (2013.01); *G11C 2207/2254* (2013.01)

(58) Field of Classification Search
CPC ........ G11C 7/00; G11C 29/52; G06F 11/1068
See application file for complete search history.

(56) References Cited

U.S. PATENT DOCUMENTS

| | | | |
|---|---|---|---|
| 7,738,292 B2 | 6/2010 | Radke | |
| 8,335,977 B2 | 12/2012 | Weingarten et al. | |
| 8,392,809 B1 | 3/2013 | Varnica et al. | |
| 8,640,002 B1 | 1/2014 | Varanasi | |
| 8,943,386 B1 | 1/2015 | Lee et al. | |
| 2007/0234184 A1 | 10/2007 | Richardson | |
| 2009/0319860 A1 | 12/2009 | Sharon et al. | |
| 2010/0088575 A1 | 4/2010 | Sharon et al. | |
| 2011/0161775 A1 | 6/2011 | Weingarten | |
| 2011/0320902 A1 | 12/2011 | Gunnam | |
| 2012/0005551 A1 | 1/2012 | Gunnam | |
| 2012/0005552 A1 | 1/2012 | Gunnam | |
| 2013/0135927 A1 | 5/2013 | Jeon | |
| 2013/0229867 A1* | 9/2013 | Tang | G11C 16/26 365/185.2 |
| 2014/0153338 A1* | 6/2014 | Byeon | G11C 16/0483 365/185.21 |
| 2015/0149871 A1 | 5/2015 | Chen et al. | |
| 2016/0350179 A1* | 12/2016 | Lin | G11C 29/52 |
| 2017/0177436 A1 | 6/2017 | Lee et al. | |

* cited by examiner

*Primary Examiner* — Mohammed A Bashar
(74) *Attorney, Agent, or Firm* — Brooks, Cameron & Huebsch, PLLC

(57) ABSTRACT

Apparatuses and methods for read threshold voltage selection are provided. One example method can include setting a first soft read threshold voltage and a second soft read threshold voltage based on a difference between a first number of memory cells that are read as being programmed to a first state when read using a first threshold voltage and a second number of memory that are read as being programmed to the first state when read using another threshold voltage.

8 Claims, 3 Drawing Sheets

READ THRESHOLD VOLTAGE SELECTION

PRIORITY INFORMATION

This application is a Divisional of U.S. application Ser. No. 15/044,185 filed Feb. 16, 2016, the specification of which is incorporated herein by reference.

TECHNICAL FIELD

The present disclosure relates generally to error correction, and more particularly, to apparatuses and methods for read threshold voltage selection.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
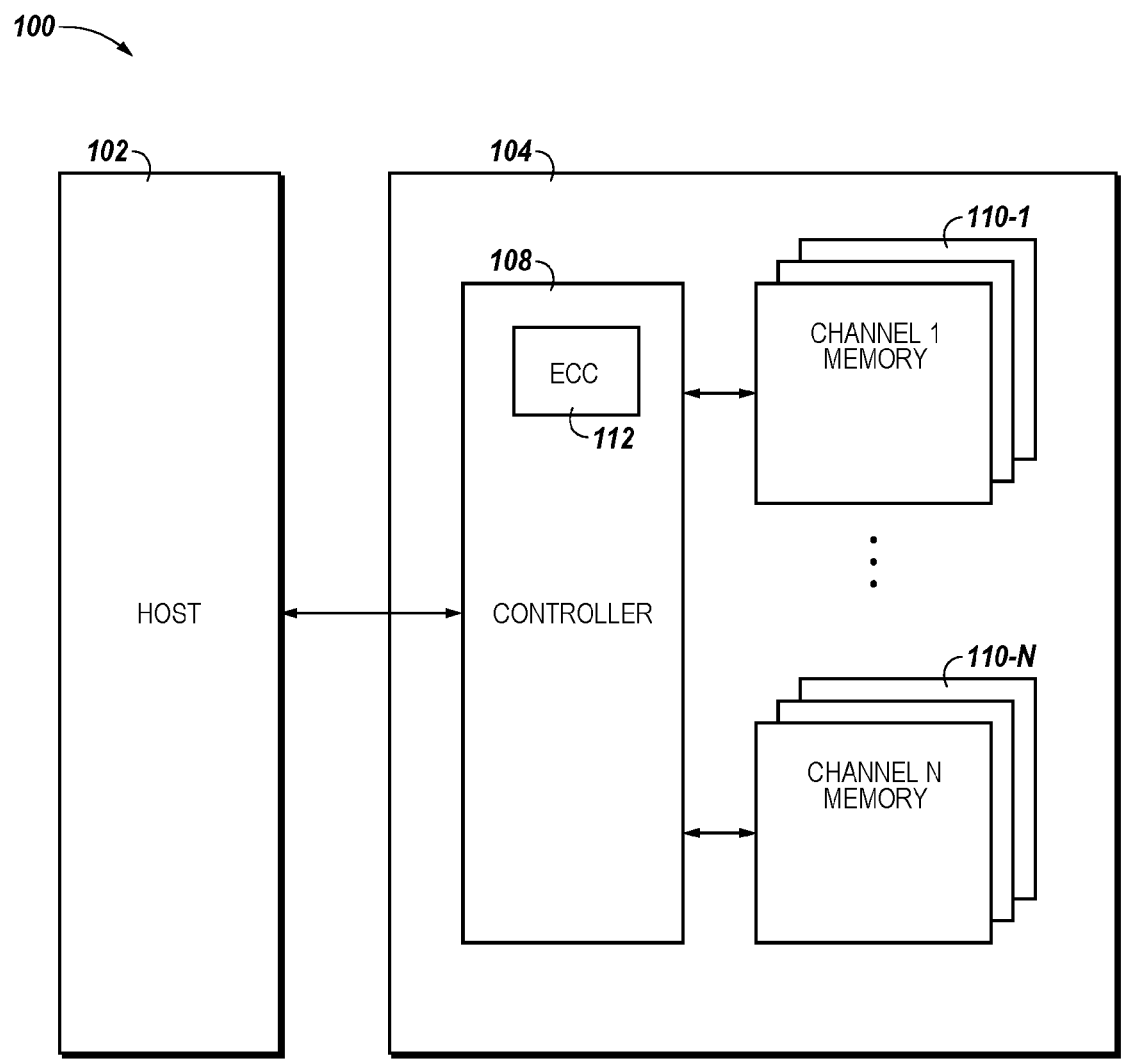
FIG. 1 is a functional block diagram of an apparatus in the form of a computing system including at least one memory system, in accordance with a number of embodiments of the present disclosure.

Apparatuses and methods for read threshold voltage selection are provided. One example method can include setting a first soft read threshold voltage and a second soft read threshold voltage based on a difference between a first number of memory cells that are read as being programmed to a first state when read using a first threshold voltage and a second number of memory cells that are read as being programmed to the first state when read using another threshold voltage.

Memory devices can include error correction circuitry (e.g., implementing an error correction code (ECC)) to correct for errors in sensing the data state of a memory cell. Hard data and soft data can be provided to the error correction circuitry. Hard data is data that corresponds only to the data state of a memory cell. For example, a 2-bit memory cell can be programmed to one of four data states, where each data state corresponds to one of hard data 00, 01, 10, or 11. In contrast, soft data associated with a memory cell can indicate a location of a state (e.g., threshold voltage (Vt)) stored on the memory cell within a distribution of states (e.g., Vt distribution) representing the target state to which the memory cell was programmed. Additionally, soft data associated with a memory cell can indicate a probability of whether the state of the memory cell corresponds to the target state to which the memory cell was programmed. Some error correction circuitry may operate more effectively with soft data.

In one or more embodiments of the present disclosure, soft data can be provided from a memory device to error correction circuitry to correct data read from a number of memory cells. The soft data can be obtained by performing a number of sensing (e.g., read and/or program verify) operations. For example, a number of sensing operations can include performing two soft read operations and a hard read operation, wherein the two soft read operations provide the soft data to the error correction circuitry and the hard read provides the hard data to the error correction circuitry. It can be desirable to provide soft data that can be successfully used by the error correction circuitry to correct errors. Soft data that is generated during read operations using soft read voltage thresholds can result in greater amounts of mutual information and can be more likely to be used successfully by error correction circuitry to correct errors. For example, soft data that is generated during read operations that use soft read voltage thresholds that result in greater amounts of mutual information is better for correcting errors via ECC than using soft read voltage thresholds that result in lesser amounts of mutual information of two adjacent threshold distributions.

In a number of embodiments, soft read threshold voltages can be set, such that a particular percentage of memory cells read as being at a particular data state during a hard read operation are located between a hard read threshold voltage and a soft read threshold voltage, to increase the probability that the soft data generated during a soft read operation can successfully be used by the error correction circuitry to correct errors. The particular percentage of memory cells read as being at a particular data state during a hard read operation that are between a hard read threshold voltage and a soft read threshold voltage can be based on mutual information. For example, a first soft read threshold voltage can be set such that a read operation using the first soft read threshold voltage generates an amount of mutual information that is at least a particular percentage of an achievable peak mutual information value.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of a computing system 100 including an apparatus in the form of at least one memory system 104, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In the embodiment illustrated in FIG. 1, the memory system 104 can include a controller 108 and one or more memory devices 110-1, . . . , 110-N. In this example, the controller 108 is external to the one or more memory devices 110-1, . . . , 110-N. The memory devices 110-1, . . . , 110-N can provide a storage volume for the memory system, e.g., with a file system formatted to the memory devices. The controller 108 can include control circuitry, e.g., hardware, firmware, and/or software. In one or more embodiments, the controller 108 can be an application specific integrated circuit (ASIC) coupled to a printed circuit board including a physical interface and memory devices 110-1, . . . , 110-N.

The controller 108 can include an error correction code (ECC) component 112. The ECC component 112 can include hardware, firmware, and/or software and can perform ECC operations on data, e.g., to correct errors in the data. For example, errors in the state of a memory cell due to threshold voltage shift can be corrected by ECC. ECC operations can include regular ECC operations used to correct errors based only on hard data and advanced ECC operations which can use soft data to correct errors. Whether regular ECC and/or advanced ECC is used can depend on the number of cells that are in error, for instance, e.g., a quantity of erroneous bits. Memory devices 110-1, . . . , 110-N can include circuitry to determine a quantity of memory cells that change states, e.g., change from state 0 to state 1, between a first sensing operation performed on a number of memory cells using a first sensing voltage and a second sensing operation performed on the number of memory cells using a second sensing voltage. The quantity of memory cells that change states between successive sensing operations can be used to set soft read threshold voltages.

As illustrated in FIG. 1, a host 102 can be coupled to the memory system 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

In one or more embodiments, a physical host interface can be in the form of a standardized interface. For example, when the memory system 104 is used for data storage in a computing system 100, a physical host interface can be a serial advanced technology attachment (SATA), peripheral component interconnect express (PCIe), or a universal serial bus (USB), among other connectors and interfaces. In general, however, a physical host interface can provide an interface for passing control, address, data, and other signals between the memory system 104 and a host 102 having compatible receptors for the physical host interface.

The controller 108 can communicate with the memory devices 110-1, . . . , 110-N to read, write, and erase data, among other operations. Controller 108 can have circuitry that may be one or more integrated circuits and/or discrete components. A controller could selectively couple an I/O connection (not shown in FIG. 1) of a memory device 110-1, . . . , 110-N to receive the appropriate signal at the appropriate I/O connection at the appropriate time. Similarly, the communication protocol between a host 102 and the memory system 104 may be different than what is required for access of a memory device 110-1, . . . , 110-N. Controller 108 can translate the commands received from a host into the appropriate commands to achieve the desired access to a memory device 110-1, . . . , 110-N.

A memory device 110-1, . . . , 110-N can include one or more arrays of memory cells, e.g., non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The memory devices 110-1, . . . , 110-N can include a number of memory cells that can be grouped. As used herein, a group can include one or more memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4314 bytes of data per page, 128 pages per block, 2048 blocks per plane, and 16 planes per device.

In a memory device, a physical page can refer to a unit of writing and/or reading, e.g., a number of cells that are written and/or read together or as a functional group of memory cells. An even page and an odd page can be written and/or read with separate writing and/or reading operations. For embodiments including multilevel cells (MLC), a physical page can be logically divided into, for example, an upper page and a lower page of data. For example, one memory cell can contribute one or more bits to an upper page of data and one or more bits to a lower page of data. Accordingly, an upper page and a lower page of data can be written and/or read as part of one writing and/or reading operation, as the logical upper page and logical lower page are both part of the same physical page.

The embodiment of FIG. 1 can include additional circuitry that is not illustrated so as not to obscure embodiments of the present disclosure. For example, the memory system 104 can include address circuitry to latch address signals provided over I/O connections through I/O circuitry. Address signals can be received and decoded by a row decoder and a column decoder to access the memory devices 110-1, ..., 110-N. It will be appreciated by those skilled in the art that the number of address input connections can depend on the density and architecture of the memory devices 110-1, ..., 110-N.

In general, the controller 108 is responsible for converting command packets received from the host 102, e.g., from a PCIe bus, into command instructions for host-memory translation circuitry and for converting memory responses into host system commands for transmission to the requesting host.

In one or more embodiments, data can be written to the memory devices one page at a time. Each page in the memory device can have a number of physical sectors and each physical sector can be associated with a logical block address (LBA). As an example, a physical page can have 8 physical sectors of data. However, embodiments are not limited to a particular number of physical sectors per physical page.

Figure 2:
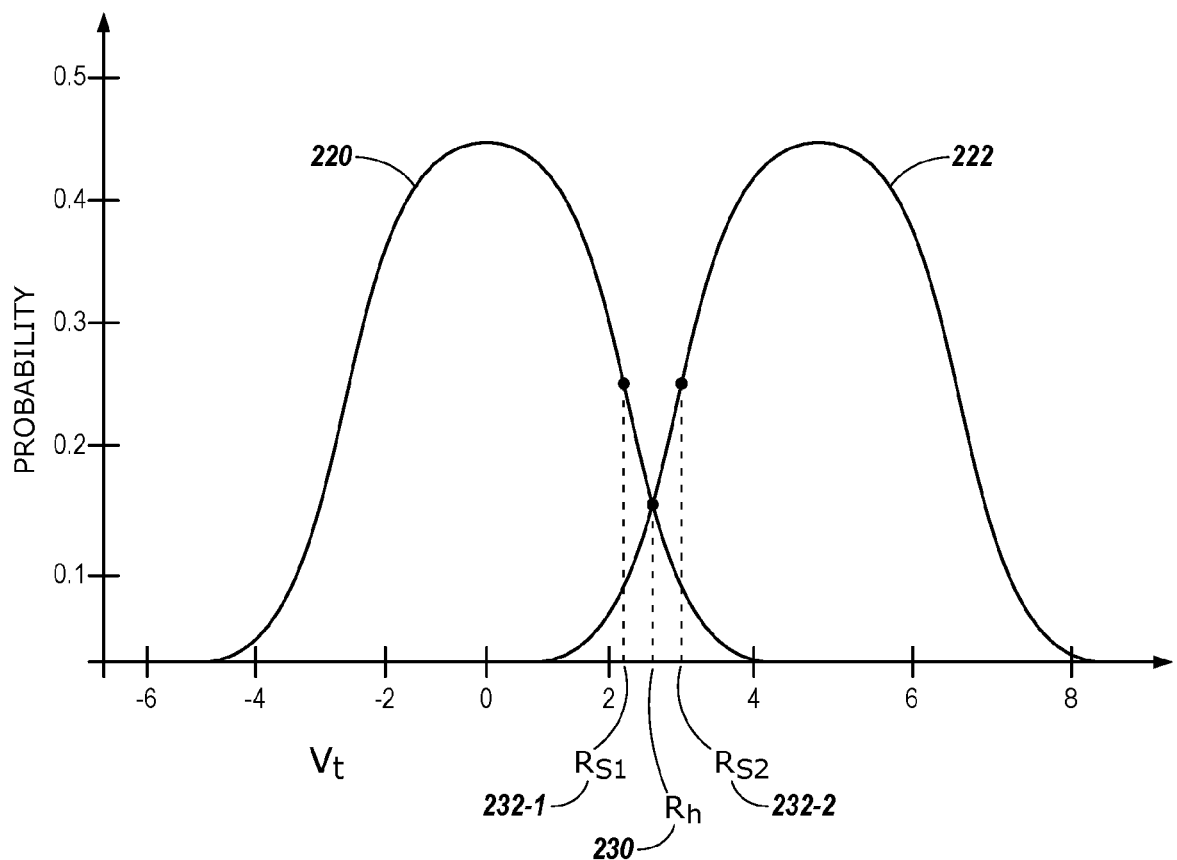
FIG. 2 illustrates a graph representing a number of threshold voltage distributions and sensing voltages in accordance with one or more embodiments of the present disclosure.

FIG. 2 illustrates a graph representing a number of threshold voltage distributions and sensing voltages in accordance with one or more embodiments of the present disclosure. The example shown in FIG. 2 represents one-bit, e.g., two-state, memory cells. However, embodiments of the present disclosure are not limited to this example of one-bit memory cells. Embodiments of the present disclosure can be used for memory cells that are programmed to any state and are part of any two adjacent threshold voltage distributions.

As shown in FIG. 2, threshold voltage (Vt) distributions 220 and 222 represent two states, e.g., L0 and L1, respectively, to which the memory cells can be programmed. State L0 can correspond to data 0 and state L1 can correspond to data 1. However, embodiments are not limited to these data assignments.

Vt distributions 220 and 222 can represent a number of memory cells that are programmed to the corresponding states, where the height of a Vt distribution curve indicates a probability that a number of cells programmed to a particular voltage within the Vt distribution, on average. The width of the Vt distribution curve indicates the range of voltages that represent a particular state, e.g., the width of the Vt distribution curve 220 for L0 represents the range of voltages that correspond to data 0.

A number of sensing voltages are illustrated in FIG. 2. Such sensing voltages can include program verify voltages and/or read voltages, among other sensing voltages. In the example illustrated in FIG. 2, voltage levels 230 ($R_h$), 232-1 ($R_{s1}$), and 232-2 ($R_{s2}$) represent sensing voltages, e.g., read voltages, that can be used to distinguish between states L0 and L1 during a sensing operation. Voltage levels 230 ($R_h$) can be a hard read threshold voltage and voltage levels 232-1 ($R_{s1}$) and 232-2 ($R_{s2}$) can be soft read threshold voltages. In a sensing operation performed on a selected memory cell in a NAND string, the unselected memory cells of the string can be biased with a pass voltage so as to be in a conducting state.

The sensed state of a memory cell can change, e.g., shift, over time due to a number of mechanisms. For example, a charge storage structure, e.g., floating gate, of the memory cell may lose charge over time. Such charge loss can cause the Vt of the cell to change, e.g., decrease. Additionally, as the memory cell undergoes programming and/or sensing operations over time, program disturb and/or read disturb mechanisms may cause the Vt of the cell to change, e.g., increase. Other mechanisms can also cause the sensed state of a memory cell to change over time, as will be appreciated by one of ordinary skill in the art.

In some instances, a Vt change can alter the sensed state of a memory cell. For example, if a memory cell were programmed to a target state of L1, e.g., data 1, charge loss could cause the Vt of the memory cell to decrease to a level within Vt distribution 220 corresponding to state L0, e.g., data 0. Accordingly, such a Vt change can result in erroneous data being sensed during a sensing operation performed on the memory cell using the sensing voltages illustrated in FIG. 2, e.g., read voltages $R_h$, $R_{s1}$, and $R_{s2}$. For example, performing a sensing operation using the sensing voltages illustrated in FIG. 2 may result in a determination that the memory cell represents a state other than the target state to which the cell was programmed. For instance, a sensing operation performed on a memory cell that was programmed to a target state of L1 and has undergone charge loss may sense the state of the cell as L0, if hard read threshold voltage Rh is used in the sensing operation. That is, using hard read threshold voltage Rh may result in a cell programmed to store data 1 being erroneously sensed as storing data 0.

As such, sensing voltages used during sensing operations performed before the Vt change occurs may no longer provide accurate and/or reliable sensing of memory cells that have undergone a Vt change, e.g., charge loss. Therefore, it can be advantageous to determine soft data associated with the memory cells to account for Vt changes in Vt distributions.

In a number of embodiments, it may be beneficial to use soft read threshold voltages $R_{s1}$, and $R_{s2}$ that attempt to maximize the mutual information. Mutual information can be calculated for memory cells comprising adjacent threshold voltage distributions, such as the threshold voltage distributions (e.g., Vt distributions 220 and 222) shown in FIG. 2 and/or a normal distribution of threshold voltages. In FIG. 2, if the Vt of the cell is to the left of a read voltage, the written bit is decided as being at state "1," and if the Vt of the cell is to the right of a read voltage, the written bit is decided as being at state "0." Therefore, if the Vt of a cell is to the left of $R_{s1}$, the cell is determined to be a Strong 1 (S1) (e.g., 1 with high probability). If the Vt of a cell falls between $R_{s1}$ and $R_h$, the cell is determined to be a Weak 1 (W1) (e.g., 1 with low probability). If the Vt of a cell falls between $R_h$ and $R_{s2}$, the cell is determined to be a Weak 0 (W0) (e.g., 0 with low probability). If the Vt of a cell is to the right of $R_{s2}$, the cell is determined to be a Strong 0 (or 0 with high probability).

The status of the memory cells (e.g., S1, W1, W0, or S0) can be used to determine mutual information for the memory cells in the two adjacent threshold voltage distributions (e.g., Vt distributions 220 and 222). The probability that memory cells have a particular status is used during the determination of mutual information. In a number of embodiments, mutual information can be determined based on a normal distribution of threshold voltages or for a distribution of memory cells randomly written to a memory device. The following equation can be used to denote an area under a normal distribution of threshold voltages:

$$Q(x) = \frac{1}{\sqrt{2\Pi}} \int_x^\infty e^{-t^2/2} dt$$

The above equation can be used to determine the following probabilities, where Q for each of the read voltages is calculated and m denotes the mean of the right side normal distribution of threshold voltages. For example, Prob (S1|0) is the probability that the determination is Strong 1 given that 0 is written.

$Pr(S1|1) = 1 - Q(R_{s1})$ $Pr(W1|1) = Q(R_{s1}) - Q(R_h)$ $Pr(W0|1) = Q(R_h) - Q(R_{s2})$ $Pr(S0|1) = Q(R_{s2})$ $Pr(S1|0) = 1 - Q(R_{s1} - m)$ $Pr(W1|0) = Q(R_{s1} - m) - Q(R_h - m)$ $Pr(W0|0) = Q(R_h - m) - Q(R_{s2} - m)$ $Pr(S0|0) = Q(R_{s2} - m)$

The probabilities from the above equations can be used in the equations below to calculate mutual information (I) for the memory cells in the normal distribution of threshold voltages. In the equations below, X represents the state to which the memory cells were programmed and Y represents the state the memory cells at which the memory cells were determined to be at while performing the read operations using the read voltages $R_h$, $R_{s1}$, and $R_{s2}$.

$H(Y|X=1) = -\text{Pro}(S1|1)\log2\,\text{Prob}(S1|1) - \text{Prob}(W1|1)\log2\,\text{Prob}(W1|1) - \text{Prob}(W0|1)\log2\,\text{Prob}(W0|1) - \text{Prob}(S0|1)\log2\,\text{Prob}(S0|1)$ $H(Y|X=0) = -\text{Pro}(S1|0)\log2\,\text{Prob}(S1|0) - \text{Prob}(W1|0)\log2\,\text{Prob}(W1|0) - \text{Prob}(W0|0)\log2\,\text{Prob}(W0|0) - \text{Prob}(S0|0)\log2\,\text{Prob}(S0|0)$ $H(Y|X) = P1 * (Y|X=1) + P0 * H(Y|X=0)$ $Pr(S1) = P0 * \text{Prob}(S1|0) + P1 * \text{Prob}(S1|1)$ $Pr(W1) = P0 * \text{Prob}(W1|0) + P1 * \text{Prob}(W1|1)$ $Pr(W0) = P0 * \text{Prob}(W0|0) + P1 * \text{Prob}(W0|1)$ $Pr(S0) = P0 * \text{Prob}(S0|0) + P1 * \text{Prob}(S0|1)$ $H(Y) = -\text{Pro}(S1)*\log2\,\text{Prob}(S1) - \text{Prob}(W1)*\log2\,\text{Prob}(W1) - \text{Prob}(W0)*\log2\,\text{Prob}(W0) - \text{Prob}(S0)*\log2\,\text{Prob}(S0)$ The mutual information (I) between X and Y can be computed as:

$I(X; Y) = H(Y) - H(Y|X)$

Mutual information can also be calculated for a group of memory cells that have been programmed to two adjacent states and read using read voltages $R_h$, $R_{s1}$, and $R_{s2}$. For example, the results of read operations using $R_h$, $R_{s1}$, and $R_{s2}$ can be:

| Number of cells written to a state | Number of cells read as Strong 1 | Number of cells read as Weak 1 | Number of cells read as Weak 0 | Number of cells read as Strong 0 |
|---|---|---|---|---|
| 1 = 8961 | 14 | 8774 | 56 | 117 |
| 0 = 9186 | 1 | 1 | 1 | 9183 |

The probabilities can be calculated and used to determine mutual information, as shown below.

Prob(S1|1) = 14/8961 = 0.0016

Prob(W1|1) = 8774/8961 = 0.9791

Prob(W0|1) = 56/8961 = 0.006

Prob(S0|1) = 117/8961 = 0.0131

Prob(S1|0) = 1/9186 = 1.0886e-4

Prob(W1|0) = 1/9186 = 1.0886e-4

Prob(W0|0) = 1/9186 = 1.0886e-4

Prob(S0|0) = 9183/9186 = 0.9997

$H(Y|X=1) = -\text{Prob}(S1|1)*\log2(\text{Prob}(S1|1)) - \text{Prob}(W1|1)*\log2(\text{Prob}(W1|1)) - \text{Prob}(W0|1)*\log2(\text{Prob}(W0|1)) - \text{Prob}(S0|1)*\log2(\text{Prob}(S0|1)) = -0.0016*\log2(0.0016) - 0.9791*\log2(0.9791) - 0.0062*\log2(0.0062) - 0.0131*\log2(0.0131) = 0.1721$ $H(Y|X=0) = -\text{Prob}(S1|0)*\log2(\text{Prob}(S1|0)) - \text{Prob}(W1|0)*\log2(\text{Prob}(W1|0)) - \text{Prob}(W0|0)*\log2(\text{Prob}(W0|0)) - \text{Prob}(S0|0)*\log2(\text{Prob}(S0|0)) = -1.0886e-4*\log2(1.0886e-4) - 1.0886e-4*\log2(1.0886e-4) - 1.0886e-4*\log2(1.0886e-4) - 0.9997*\log2(0.9997) = 0.0047$ $H(Y|X) = \text{Prob}(1)*H(Y|1) + \text{Prob}(0)*H(Y|0) = 0.4938*0.1721 + 0.5062*0.0047 = 0.0874$ $\text{Prob}(S1) = \text{Prob}(1)*\text{Prob}(S1|1) + \text{Prob}(0)*\text{Prob}(S1|0) = 0.4938*0.0016 + 0.5062*1.0886e-4 = 8.4504e-4$ $\text{Prob}(W1) = \text{Prob}(1)*\text{Prob}(W1|1) + \text{Prob}(0)*\text{Prob}(W1|0) = 0.4938*0.9791 + 0.5062*1.0886e-4 = 0.4835$ $\text{Prob}(W0) = \text{Prob}(1)*\text{Prob}(W0|1) + \text{Prob}(0)*\text{Prob}(W0|0) = 0.4938*0.0062 + 0.5062*1.0886e-4 = 0.0031$ $\text{Prob}(S0) = \text{Prob}(1)*\text{Prob}(S0|1) + \text{Prob}(0)*\text{Prob}(S0|0) = 0.4938*0.0131 + 0.5062*0.9997 = 0.5125$ $H(Y) = -\text{Prob}(S1)*\log2(\text{Prob}(S1) - \text{Prob}(W1)*\log2(\text{Prob}(W1) - \text{Prob}(W0)*\log2(\text{Prob}(W0) - \text{Prob}(S0)*\log2(\text{Prob}(S0) = -8.4504e-4*\log2(8.4504e-4) - 0.4835*\log2(0.4835) - 0.0031*\log2(0.0031) - 0.5125*\log2(0.5125) = 1.0356$ $I(X; Y) = H(Y) - H(Y|X) = 1.0356 - 0.0874 = 0.9482$ In the example above, the mutual information (I) for the group of memory cells programmed to two adjacent states and read using particular read voltages is 0.9482. Mutual information for a group of memory cells can be calculated for each set of read voltages that are used to during read operations. For example, read operations can include a hard read threshold voltage and two soft read threshold voltages.

The above equations can be used to calculate mutual information on the results of a particular combination of read voltages. In a number of embodiments, a hard read threshold voltage that corresponds to a voltage at the intersection of two adjacent threshold voltage distributions and two soft read threshold voltages, one higher and one lower than the hard read threshold voltage, can be used during read operations.

In various embodiments, it can be beneficial to set the soft read threshold voltages so that an amount of mutual information corresponding to the soft read threshold voltages is as great as possible. It can be difficult and/or time consuming to determine the greatest amount of mutual information that can be associated with two adjacent threshold voltage distributions. It is easier and less time consuming to determine a quantity of memory cells that are in a particular state (e.g., Strong 1, Weak 1, Weak 0, Strong 0) for a particular set of read voltages. Therefore, the relationship between memory cells being at a particular state and the corresponding mutual information for the memory cells can be determined when the memory cells are read with a particular set of read voltages.

In a number of embodiments, soft read threshold voltages can be selected such that a particular percentage of memory cells read as being at a particular data state during a hard read operation are between a hard read threshold voltage and a soft read threshold voltage. This increases the probability that the soft data generated during a soft read operation can successfully be used by the error correction circuitry to correct errors. The particular percentage of memory cells read as being at a particular data state during a hard read operation that are between a hard read threshold voltage and a soft read threshold voltage can be based on mutual information of two adjacent threshold voltage distributions. For example, a first soft read threshold voltage can be set such that a read operation using the first soft read threshold voltage generates an amount of mutual information that is at least a particular percentage of an achievable peak mutual information value for two adjacent threshold voltage distributions. In a number of embodiments, the soft read threshold voltages can be set such that mutual information is approximately 99% or 99.5% of an achievable peak mutual information value, for example. In one example, as will be described below in association with FIGS. 3A and 3B, a number of memory cells that are a Weak 0 can be between 1% and 9% of a total number of memory cells read as Strong 0 and Weak 0 to ensure that mutual information is approximately 99% of an achievable peak mutual information value. In other embodiments example, a number of memory cells that are a Weak 0 can be between 1% and 5% of a total number of memory cells read as Strong 0 and Weak 0 to ensure that mutual information is approximately 99.5% of an achievable peak mutual information value. Therefore, soft read threshold voltages can be set so that the number of memory cells that are a Weak 0 is between particular percentages of a total number of memory cells read as Strong 0 and Weak 0, such as 1% and 9% or 1% and 5% for example. The determination of the number of memory cells that are a Weak 0 can involve fewer calculations and can be less time consuming than determining the mutual information.

In a number of embodiments, the soft read threshold voltages can be determined by calculating the hard read threshold voltage (e.g., the voltages at the intersection of two adjacent threshold voltage distributions). Read operations that use the hard read threshold voltage yield a minimum bit error rate. A read operation using the hard read threshold voltage can be performed and a number of memory cells at a particular state (n) (e.g., state 0) can be determined. The 1%, 5%, and 9% values of n can be calculated. A number of soft read operations can be performed using a number of soft read threshold voltages. The number of memory cells at Weak 0 (m) can be determined for each of the number of soft read operations. The number of memory cells at Weak 0 (p) is the difference between the number of memory cells determined to be at state 0 during the hard read operation and the number of memory cells determined to be at state 0 during a soft read operation. A soft read threshold voltage can be set at a particular voltage when the results of a soft read operation including the particular voltage are:

$$x*n \leq p \leq y*n$$

wherein x and y are particular percentages. The particular percentage of x and y can be any value. For example, x can be 1% and y can be 5% or 9%. The particular percentage of x and y can be based on the mutual information for the memory cells read with a particular set of read voltages.

Figure 3A:
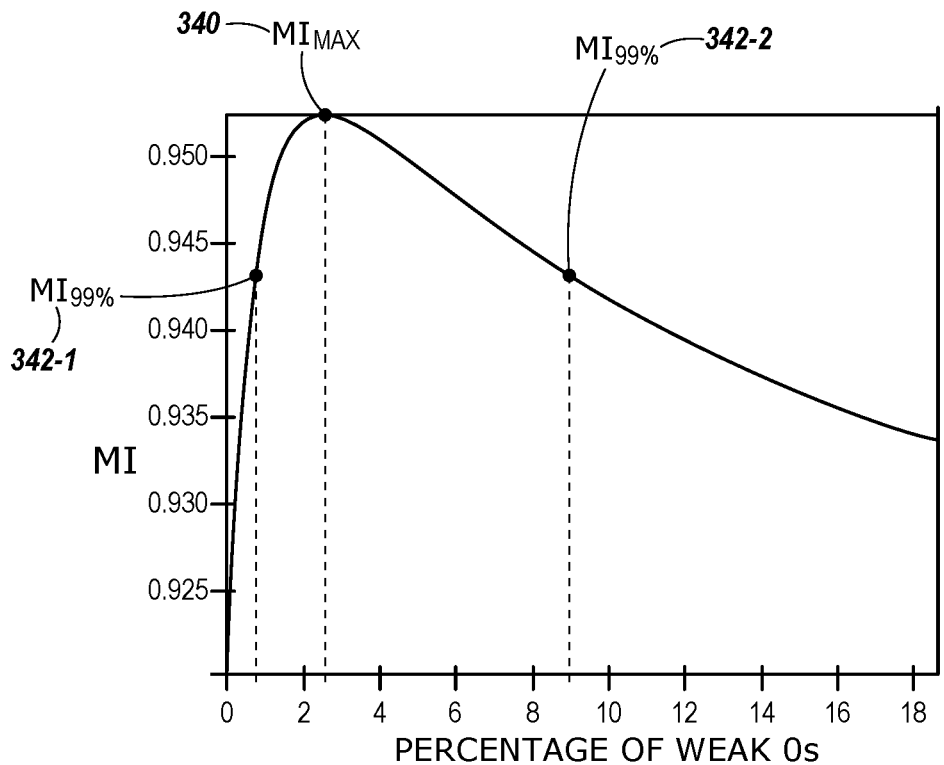
FIGS. 3A and 3B are tables illustrating mutual information for threshold voltage distributions in accordance with a number of embodiments of the present disclosure.
Figure 3B:
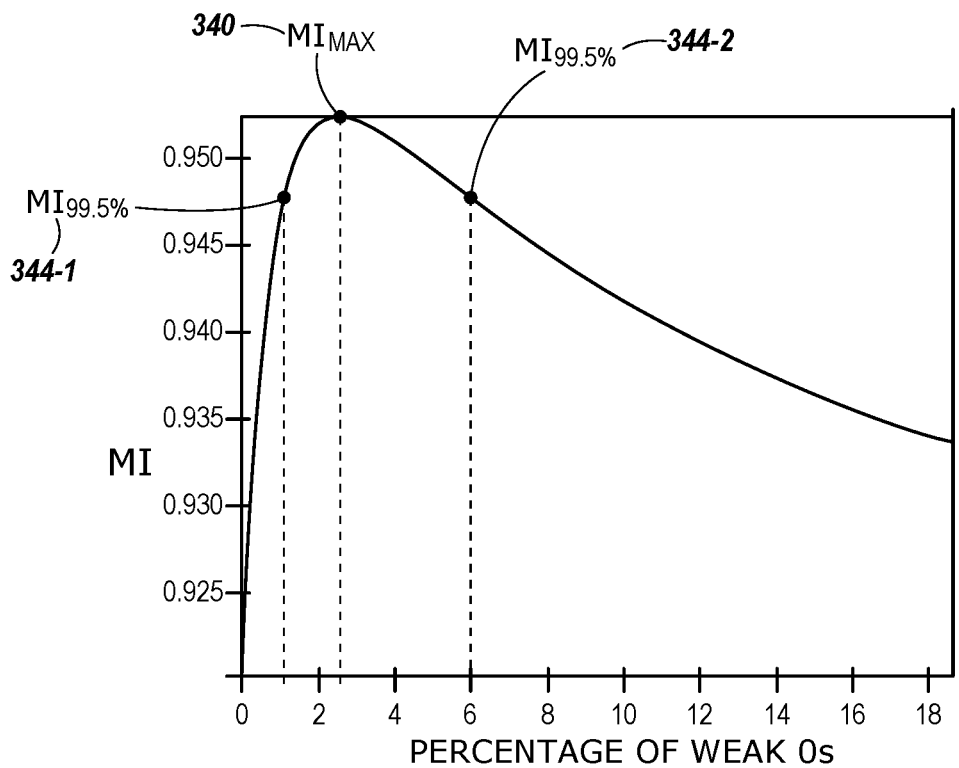

FIGS. 3A and 3B are tables illustrating mutual information for threshold distributions in accordance with a number of embodiments of the present disclosure. In FIGS. 3A and 3B mutual information is plotted against the percentage of memory cells at Weak 0 at a number of soft read threshold voltages. In FIG. 3A, the maximum (e.g. peak) mutual information ($MI_{max}$) 340 for a group of memory cells from adjacent threshold voltage distributions is 0.9525. FIG. 3A also illustrates $MI_{99\%}$ 342-1 and 342-2, where mutual information is at 99% of $MI_{max}$. As shown in FIG. 3A at 342-1 and 342-2, if the mutual information for the group of memory cells is to be at least 99% of $MI_{max}$, the soft read threshold voltages should be set so that the percentage of memory cell at Weak 0 is between 1% and 9% of the total number of memory cells at state 0.

In the example of FIG. 3B, the maximum mutual information ($MI_{max}$) 340 for a group of memory cells from adjacent threshold voltage distributions is 0.9525. FIG. 3B also illustrates $MI_{99.5\%}$ 344-1 and 344-2, where mutual information is at 99.5% of $MI_{max}$. As shown in FIG. 3B at 342-1 and 342-2, if the mutual information for the group of memory cells is to be at least 99.5% of $MI_{max}$, the soft read threshold voltages should be set so that the percentage of memory cell at Weak 0 is between 1% and 6% of the total number of memory cells at state 0.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for read threshold voltage selection, comprising:
    setting a first soft read threshold voltage based on mutual information of two adjacent threshold voltage distributions, wherein:
        the two adjacent threshold voltage distributions include a first threshold voltage distribution including memory cells programmed to a first state and a second threshold voltage distribution including memory cells programmed to a second state; and
        the method includes setting the first soft read threshold voltage such that a read operation using the first soft read threshold voltage results in an amount of mutual information that is at least 99.5% of an achievable mutual information value for the two adjacent threshold voltage distributions.

2. The method of claim 1, wherein the method includes setting the first soft read threshold voltage such that a read operation using the first soft read threshold voltage results in an amount of mutual information that is at least a particular percentage of an achievable peak mutual information value for the two adjacent threshold voltage distributions.

3. The method of claim 1, the method includes setting the first soft read threshold voltage as an offset from a hard read threshold voltage for the two adjacent threshold voltage distributions.

4. The method of claim 1, the method includes setting a second soft read threshold voltage as an offset from a hard read threshold voltage for the two adjacent threshold voltage distributions, wherein the offset from the hard read threshold voltage is equal for the first soft read threshold voltage and the second soft read threshold voltage.

5. A method for read threshold voltage selection, comprising:
    setting a first soft read threshold voltage based on mutual information of two adjacent threshold voltage distributions, wherein:
        the two adjacent threshold voltage distributions include a first threshold voltage distribution including memory cells programmed to a first state and a second threshold voltage distribution including memory cells programmed to a second state; and
        the method includes setting the first soft read threshold voltage such that a read operation using the first soft read threshold voltage results in an amount of mutual information that is at least 99% of an achievable peak mutual information value for the two adjacent threshold voltage distributions.

6. The method of claim 5, wherein the method includes setting the first soft read threshold voltage such that a read operation using the first soft read threshold voltage results in an amount of mutual information that is at least a particular percentage of an achievable peak mutual information value for the two adjacent threshold voltage distributions.

7. The method of claim 5, wherein the method includes setting the first soft read threshold voltage as an offset from a hard read threshold voltage for the two adjacent threshold voltage distributions.

8. The method of claim 5, wherein the method includes setting a second soft read threshold voltage as an offset from a hard read threshold voltage for the two adjacent threshold voltage distributions, wherein the offset from the hard read threshold voltage is equal for the first soft read threshold voltage and the second soft read threshold voltage.

* * * * *